United States Patent
Xu et al.

(10) Patent No.: US 7,210,089 B2
(45) Date of Patent: Apr. 24, 2007

(54) COMMUNICATION SYSTEM EMPLOYING TURBO CODES AND A HYBRID AUTOMATIC REPEAT REQUEST SCHEME

(75) Inventors: Chang Qing Xu, Singapore (SG); Ju Yan Pan, Singapore (SG); Hiroshi Katsuragawa, Singapore (SG)

(73) Assignee: Oki Techno Centre (Singapore) PTE Ltd., Singapore (SG)

( * ) Notice: Subject to any disclaimer, the term of this patent is extended or adjusted under 35 U.S.C. 154(b) by 376 days.

(21) Appl. No.: 10/193,144

(22) Filed: Jul. 12, 2002

(65) Prior Publication Data

US 2003/0135811 A1 Jul. 17, 2003

(30) Foreign Application Priority Data

Jan. 17, 2002 (SG) .............................. 200200316-8

(51) Int. Cl.
*H03M 13/00* (2006.01)
*H04L 1/18* (2006.01)

(52) U.S. Cl. ................ 714/751; 714/774; 714/790

(58) Field of Classification Search ................ 714/751, 714/774
See application file for complete search history.

(56) References Cited

U.S. PATENT DOCUMENTS 5,983,382 A * 11/1999 Pauls .......................... 714/744
6,247,150 B1 * 6/2001 Niemela ...................... 714/701
6,298,461 B1 * 10/2001 Tong et al. .................. 714/755
6,697,986 B2 * 2/2004 Kim et al. ................... 714/751
6,704,898 B1 * 3/2004 Furuskar et al. ............. 714/751

FOREIGN PATENT DOCUMENTS

| EP | 1124344 A1 * | 8/2001 |
| WO | WO 01/03369 A1 | 1/2001 |
| WO | WO 01/37433 A1 | 5/2001 |
| WO | WO 01/91355 A1 | 11/2001 |

OTHER PUBLICATIONS

Wu, Yufei. "An ARQ Technique Using Related Parallel and Serial Concatenated Convolutional Codes." IEEE International Conference on Communications. Jun. 2000. Available HTTP: http://www.ee.vt.edu/~yufei/writeups/Wu_Valenti_icc2k.pdf.*

(Continued)

*Primary Examiner*—Albert Decady
*Assistant Examiner*—Steve Nguyen
(74) *Attorney, Agent, or Firm*—Venable LLP; Michael A. Sartori; Catherine M. Voorhees

(57) ABSTRACT

A communications system employs a HARQ method and, for at least some transmission formats, incremental redundancy (IR) signals. For such formats, the multiple IR signals are derived from a single turbo encoded signal by forming multiple permutations of the encoded signal. The permutations are then converted to the coding rate of the selected transmission format. It is demonstrated by simulation that the present proposal achieves a better performance than the known HARQ techniques, while its implementation is simpler. For certain transmission formats, the transmitted signal in response to a retransmission request is identical to the first transmitted signal.

13 Claims, 2 Drawing Sheets

OTHER PUBLICATIONS

Panaosonic. Personal of bit mapping for type-III HARQ. Jan. 15-18, 2001. Available HTTP: http://www.3gpp.org/ftp/tsg_ran/WG1_RL1/TSGR1_18/Docs/PDFs/R1-01-0031.pdf.*

3rd Generation Partnership Project; Technical Specification Group Group Radio Access Network; Multiplexing and channel coding (FDD) (3G TS 25.212 version 3.1.0), 1999.*

Motorola, R1-01-1014, 3GPP TSG RAN1 Ad Hoc on HSDPA, France "A New Hybrid-ARQ Scheme Using Incremental Redundancy" Nov. 5-7, 2001, pp. 1-11.

Ericsson, R1-01-1045, 3GPP TSG RAN1 AH32 on (HSDPA), France "Rate Matching for Incremental Redundancy in HSDPA" Nov. 5-7, 2001, pp. 1-5.

Motorola, R1-01-1015, 3GPP TSG RAN1 Ad Hoc on HSDPA, France "Performance Comparison of Various Incremental Redundancy (IR) Schemes" Nov. 5-8, 2001, pp. 1-10.

Siemens, R1-01-1028, 3GPP TSG RAN1 AH32 on (HSDPA), France "Implementation of Incremental Redundancy by Means of Rate Matching" Nov. 5-7, 2001, pp. 1-18.

* cited by examiner

COMMUNICATION SYSTEM EMPLOYING TURBO CODES AND A HYBRID AUTOMATIC REPEAT REQUEST SCHEME

FIELD OF THE INVENTION

The present invention relates to a communication system which operates a hybrid automatic repeat request (HARQ) scheme. The invention further relates to the methods of signal transmission and reception performed by the communication system, and to transmitters and receivers within the system.

BACKGROUND OF THE INVENTION

Many communication systems can be generally described as including a first unit (transmitter) which is to send a message to a second unit (a receiver). Frequently, the transmitter includes an encoder for using the message to generate a signal which is actually transmitted, and the receiver includes a corresponding decoder for reconstructing the message from the signal.

Recently turbo codes have become widely used in such communication systems. FIG. 4 shows schematically the structure of an encoder 20 used to produce a turbo code signal with a coding rate (i.e. the ratio of the number of bits of the message input to the encoder to the number of bits output as the signal) of ⅓. A message enters the encoder 20 from the left of FIG. 4 as a bit stream. Each input bit is output as corresponding "systematic bit" S. The input bit stream is also transmitted to a first convolutional encoder 23. The input bit stream is also transmitted to an interleaver 21, and from there to a second convolutional encoder 25. For each "systematic bit" S output by the encoder, the first convolutional encoder 23 generates a corresponding first parity bit P1, and the second convolutional encoder 25 generates a corresponding second parity bit P2.

There are various ways to modify the encoder 20 of FIG. 4 to get a coding rate of ¼. One is provide an extra interleaver receiving the output of interleaver 21, and an extra convolutional encoder receiving the output of the extra interleaver. Another method is to generate ¼ Turbo codes from ⅓ Turbo codes by rate matching (bits repetition). A third method is to generate ¼ Turbo codes from ⅕ Turbo codes by rate matching (bits puncturing). Note in this case, two convolutional encoders with coding rate of ½ are used to obtain the ⅕ Turbo codes.

The receiver reconstructs the message from this message using a decoder which operates, in a well known fashion, using a forward error correction (FEC) algorithm.

Such communication systems frequently have to operate at multiple coding rates. To do so they frequently employ "rate matching". That is, a rate matching unit in the transmitter processes the output of the encoder to convert its coding rate to a second coding rate. In the case that the second coding rate is higher than the encoder's coding rate, the rate matching is performed by "puncturing" the encoder output (i.e. omitting bits of it). In the case that the second coding rate is lower than the encoder's coding rate, "repetition" is performed (i.e. the encoder output is modified so that one or more of its bits are repeated). The output of the rate dematching unit is then transmitted by a physical signal transmission unit (such as a radio transmission unit in the case that the communication is by radio) to the receiver as a signal (e.g. data packet).

For many communication systems, in the case that the receiver is unable to reconstruct the message from the signal it receives (due to noise) the receiver is able to cause the transmitter to transmit a further signal (also derived from the message) to the receiver. For example, in the case that a certain message not correctly reconstructed, the receiver may send a NACK signal to the transmitter, which responds by transmitting the further signal. As discussed below, the further signal may be identical to the further signal, or may be different. In some systems, this loop can be performed until the receiver correctly reconstructs the message. In other systems, there are a maximum number of transmissions.

To meet the demand for the wideband and high data rate multimedia communications, several advanced technologies have been proposed to achieve high peak data rate. Hybrid automatic repeat request (HARQ) communication is one of them. HARQ is defined as any combined ARQ and forward error correction code (FEC) method in which the receiver stores failed decoding attempts (i.e. received signals which the decoder failed to decode) for future joint decoding. HARQ is an implicit link adaptation technique.

There are two major methods for implementing HARQ—Chase combining and Incremental Redundancy (IR). Chase combining involves the retransmission by the transmitter of the same coded data packet. The decoder at the receiver combines these multiple copies of the transmitted packet weighted by the received signal to noise ratio (SNR). Diversity gain is thus obtained. Incremental redundancy is another implementation of the HARQ technique wherein instead of sending simple repeats of the entire coded packet, additional redundant information is incrementally transmitted if the decoding fails on the first attempt. In this case, there are several different transmission versions of the coded packet.

In general, IR can only provide significant gain for high coding rate (greater than or equal to 0.5) and high order modulation (greater than or equal to 16) compared with Chase combining. Meanwhile, IR is much more complex in terms of memory, processing, and signalling requirements.

Motorola has proposed a HARQ scheme based on block interleaving and bit priority mapping (BMP) [1]. This scheme is quite complex as it employs block interleaving and BMP to generate different IR redundancy versions. Ericsson introduced a HARQ scheme based on rate matching technique [2]. It uses two stages of rate matching to generate IR redundancy versions and only two IR redundancy versions can be generated. The frame error rate (FER) performances of these two methods are quite similar and no significant gain is observed compared with that of Chase combining [3]. In [4], Siemens proposed a HARQ scheme by means of rate matching and symbol mapping based on priority (SMP). This method provides 0.9 dB gain over Chase combining for 16 QAM with coding rate of ½. For 16 QAM with coding rate of ¾, the corresponding gain is 1.7 dB. All these gains are measured at FER with 0.01 in Additive Wideband Gaussian Noise (AWGN) channel.

As mentioned previously, the challenges of HARQ implementation for communication systems using Turbo codes are a) how to keep the scheme as simple as possible; b) how to achieve as much gain as possible. The method from Motorola is very complex and provides marginal gain over Chase combining. The method from Ericsson is simple but there is no significant gain over Chase combining. The method from Siemens can provide some gain over Chase combining but it is also complex.

SUMMARY OF THE INVENTION

The present invention aims to provide new and useful methods and systems for data communication.

In general terms the present invention proposes a HARQ system which uses IR for at least one transmission format. The multiple IR signals are derived from a single encoded signal (i.e. the output of an encoder) by permuting and rate converting that encoded signal in respective ways.

As demonstrated below by simulation, the present proposal achieves a better performance than the known techniques described above, while its implementation is simpler.

Specifically, in a first expression, the present invention proposes a method of transmitting a message comprising:
  (i) generating from the message a first version of encoded data having a first coding rate;
  (ii) permuting said first version to obtain at least one further version of said data also having the first coding rate;
  (iii) converting one of said versions to a second coding rate, and transmitting a first signal generated from the converted version; and
  (iv) in response to a retransmission request, transmitting a further signal generated from another of said versions and having said second coding rate.

The various versions may be stored (in a buffer unit called here a redundancy version store) at the first coding rate and one of the stored versions is converted to the second coding rate upon receipt of a retransmission request.

It is particularly envisaged that the invention will be useful when the second coding rate is higher than the first coding rate (so that the rate matching includes puncturing). If the encoding is turbo encoding, then the encoded data includes systematic bits and parity bits. In this case the first transmitted signal preferably includes the systematic bits but punctures the parity bits.

Generally, the transmitter will be able to operate in any of plural transmission formats, each associated with corresponding coding rates (which need not all be different from each other). That is, said transmissions are in a selected one of the formats.

Note that it is not necessary to the invention that IR is used for all transmission formats. For example, the extra complexity required to perform the permutation may not be sufficiently advantageous for certain formats. Thus, for some formats, step (iv) may be replaced by a step of retransmitting the first transmitted signal in response to the retransmission request.

In a second expression, the present invention provides a transmitter for use in a communication system, the transmitter comprising:
  (i) an encoder for receiving a message and using the message to generate a first version of encoded data having a first coding rate;
  (ii) a permutation unit for permuting said first version to obtain at least one further version of said encoded data also having the first coding rate;
  (iii) a rate matching unit for converting data at the first coding rate to a second coding rate;
  (iv) a signal transmission unit for receiving the output of the rate matching unit and transmitting a corresponding signal at the second coding rate; and
  the transmitter being arranged to transmit a first signal at the second coding rate derived from one of said versions, and, in response to a retransmission request, to transmit a further signal at the second coding rate generated from another of said versions.

A further expression of the invention is a communication system including at least one transmitter as described above, and at least one receiver adapted to receive signals from the transmitter and reconstruct messages from them.

Other independent aspects of the invention are: the receiver itself; the method performed by the receiver; and the overall communication method performed by at least one such transmitter and at least one such receiver.

BRIEF DESCRIPTION OF THE FIGURES

Non-limiting embodiments of the invention will now be described for the sake of example only with reference to the following figures, in which.

DETAILED DESCRIPTION OF THE EMBODIMENTS

Figure 1:
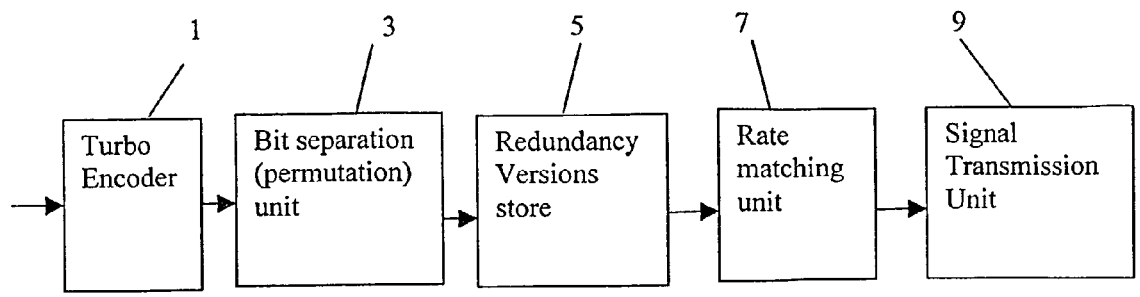
FIG. 1 shows the general construction of a transmitter which is an embodiment of the invention.

Three embodiments of the present invention will be described in detail below, but all have the general structure illustrated in FIG. 1.

A message to be transmitted to a receiver (not shown in FIG. 1) is input (from the left of FIG. 1) to a Turbo encoder 1 (which may be of any known form) to generate an encoded signal. The encoded signal is transmitted from the encoder 1 to a bit separation unit 3 (here referred to as a permutation unit 3) which permutes the encoded signal in multiple ways to generate respective multiple versions of the encoded signal. The multiple versions of the encoded signal are stored in the redundancy versions store 5. When it is desired to transmit a message, a selected one of the versions in the redundancy versions store 5 is transmitted to a rate matching unit 7, which converts the selected version of the encoded signal to a suitable coding rate. The output of the rate matching unit 7 is transmitted to a physical signal transmission unit 9 (e.g. radio transmission unit if the signal is to be transmitted by radio).

Upon receiving a NACK (no acknowledgement), a further selected one of the versions is transmitted from the redundancy versions store 5 to the rate matching unit 7, which converts the selected version of the encoded signal to a suitable coding rate. The output of the rate matching unit 7 is again transmitted to the signal transmission unit 9.

Optionally, if it is also desired that the embodiment is capable (e.g. for certain transmission formats) of generating signals for Chase combining in the receiver as in the prior art, this can be obtained by ensuring that a single one of the multiple versions in the redundancy versions store 5 is always selected for transmission to the rate matching unit. Note that there various alternative, but functionally equivalent ways, in which this can be achieved. For example, the permutation unit 3 can be bypassed, so that the redundancy versions store 5 only receives one version of the encoded signal for each message.

We now analyse the three embodiments in detail.

As the first embodiment of the invention, consider a wideband code division multiple access (WCDMA) communication system using Turbo codes with coding rate of ⅓. Five modulation and coding schemes (MCS) are supported by this system. These are QPSK with coding rate of ¼, QPSK with coding rate of ½, QPSK with coding rate of ¾, 16QAM with coding rate of ½ and 16QAM with coding rate of ¾. Rate matching (puncturing or repetition) is employed to adjust the coding rates. As explained above with reference to FIG. 3, the output of the turbo encoder 1 is represented as (S, $P_1$, $P_2$). We refer to this encoded signal as "version 1". The rate matching unit 5 is arranged, upon receiving this encoded signal to transmit the systematic bits and repeat or puncture the parity bits to get the desired coding.

Within the embodiment, the permutation unit 3 produces a further three redundancy versions:

Version 2, ($P_1$, $P_2$, S). In this version, all the parity bits $P_1$ will be transmitted and parity bits $P_2$ and the systematic bits S will be punctured or repeated by the rate matching unit 5 to obtain the required coding rate;

Version 3, ($P_2$, S, $P_1$). In this version, all the parity bits P2 will be transmitted and parity bits $P_1$ and the systematic bits S will be punctured or repeated by the rate matching unit 5 to get the desired coding rate.

Version 4. (S, $P_2$, $P_1$). The difference between version 1 and version 4 is that parity bits $P_1$ and $P_2$ are swapped. The reason for including this version is that parity bits $P_1$ and $P_2$ will then be punctured by the rate matching unit 5 with different puncturing patterns.

We prefer that the embodiment should use IR for high coding rate and high order modulation only. Specifically, IR according to the invention will preferably be employed for QPSK with coding rate of ¾, 16QAM with coding rate of ½ and 16QAM with coding rate of ¾. For QPSK with coding rate of ¼ and QPSK with coding rate of ½, Chase combining will be used, as in the prior art.

Initially, the first version (S, $P_1$, $P_2$) of the encoded signal is transmitted to the rate matching unit 7. The result is transmitted by the transmission unit 9 as a first transmission to the receiver.

Considering first the case that Chase combining is desired in the receiver, if no acknowledgement (NACK) is received from the receiver after the first transmission, then the first version is sent again to the rate matching unit 7, and the result is retransmitted as a second transmission by the transmission unit 9. This second transmission is identical to the first one. This scheme is continued until the maximum number of transmission attempts is reached.

By contrast, considering the case that IR in the receiver is desired, then following the NACK, version 2 is transmitted to the rate matching unit 7, to produce a second transmission by the transmission unit 9. Following a further NACK, version 3 is used to generate the third transmission. Following a further NACK, version 4 is used to generate the fourth transmission. Further retransmissions, if any, can be generated by further selections from among the four versions stored in the redundancy version store 5.

The scheme thus has the following attributes:

It is easy to implement. Actually, only one extra operation is needed: reordering of the encoded bits by the permutation unit 3.

A single transmitter can support both IR and Chase combining.

We will now present a simulation of the effects of the first embodiment. The simulation conditions are shown in Table 1. Since multicode applications are the most common applications for high data rate WCDMA, we only present the results for 5 code cases. Note that Ior/Ioc is defined as the carrier to noise ratio of the transmission channel.

TABLE 1

| Parameter | Value |
|---|---|
| Carrier Frequency | 2 GHz |
| Chip Rate | 3.84 M |
| Propagation Conditions | AWGN |
| HSDPA Frame Length | 2 ms |
| Ior/Ioc | Variable |
| Spreading Factor | 16 |
| Modulations | QPSK (¼, ½, ¾) 16QAM (½, ¾) |
| Channel Coding | Turbo Code (PCCC), ⅓ |
| Max no. of Iterations for the Turbo Coder 1 | 6 |
| Metric for Turbo Coder 1 | Max-log MAP |
| Input to Turbo Decoder | Soft |
| Turbo Interleaver | Random |
| HARQ | Proposed IR Scheme |
| Max no. of Transmission Attempts | 4 |

Figure 2:
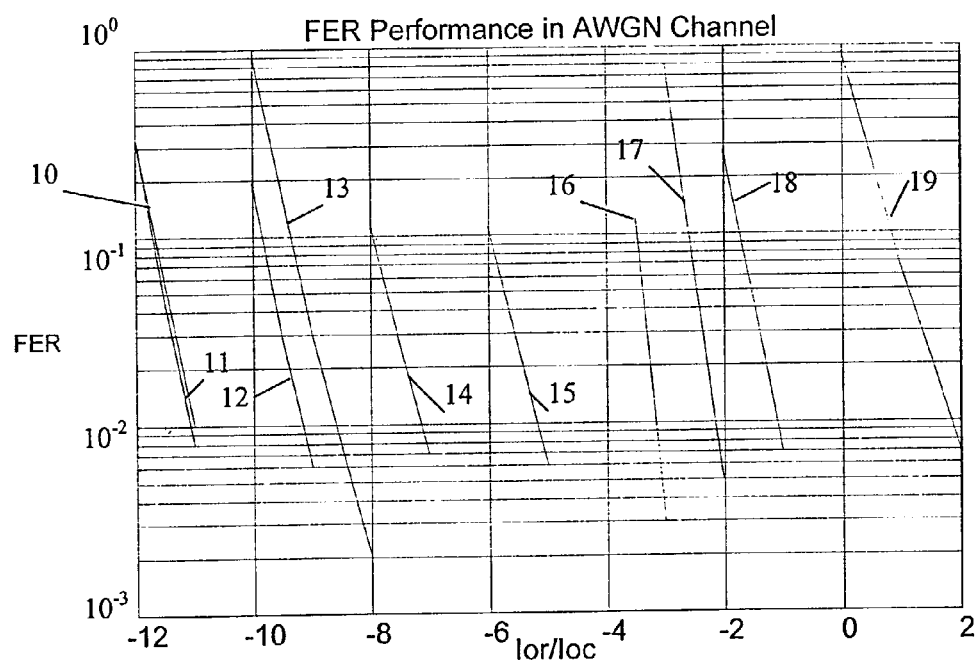
FIG. 2 shows the results of a simulation comparing known Chase combining and transmission by the embodiment of FIG. 1 in the presence of additive white Gaussian noise.

FIG. 2 illustrates the Frame Error Ratio (FER) performance of the proposed IR scheme in an additive white Gaussian noise (AWGN) channel after four transmissions. The FER performance of Chase combining is also presented as a reference. The meaning of each of the lines of FIG. 2 is given in table 2. For ¾ 16QAM, the proposed IR scheme outperforms Chase combining with a margin of 2.86 dB. For ½ 16QAM, the gain of the proposed IR scheme over Chase combining is 1 dB. For ¾ QPSK, 2 dB gain can be obtained with the proposed IR scheme. Even for ½ QPSK, 0.64 dB can be observed. All the gains are measured at a FER level of 0.01. As expected, there is no significant gain for ¼ QPSK.

TABLE 2

| Line Label in FIG. 2 | Significance |
|---|---|
| 10 | ¼ QPSK Chase |
| 11 | ¼ QPSK IR |
| 12 | ½ QPSK IR |
| 13 | ½ QPSK Chase |
| 14 | ¾ QPSK IR |
| 15 | ¾ QPSK Chase |
| 16 | ½ 16QAM IR |
| 17 | ½ 16QAM Chase |
| 18 | ¾ 16QAM IR |
| 19 | ¾ 16QAM Chase |

Table 3 provides a comparison between the first embodiment of the present invention and the different prior art implementations described above. The comparison is in terms of operation complexity and FER performance. It is seen that the first embodiment can provide the best FER performance. Meanwhile, the operation of the first embodiment is simpler than that of the three prior art implementations.

TABLE 3

| Features | Motorola | Ericsson | Siemens | First embodiment |
|---|---|---|---|---|
| Operation Complexity | Very Complex | Simple | Complex | Simplest |
| FER Performance | No significant gain over Chase | No significant gain over Chase | 1.7 dB better than Chase | 2.86 dB better than Chase |

We now turn to a second embodiment, which is a variation of the first embodiment. The maximum number of transmission attempts is limited to 3. Consequently, there are only 3 types of different IR redundancy versions: Version 1, Version 2 and Version 3. Other conditions are same as those of the first embodiment. The hardware units shown in FIG. 1 are the same in the first and second embodiments.

The operation of the second embodiment is as follows:

As in the first embodiment, version 1 is initially transmitted from the redundancy version store 5 to the rate matching unit 7. The result is transmitted to the transmission unit 9 which produces a first transmission.

In the case that the receiver is performing Chase combining, if no acknowledgement (NACK) is received after the initial transmission, then the first version is sent again to the rate matching unit 7, and the result is retransmitted as a second transmission by the transmission unit 9. If NACK is received again, then the first version is sent again to the rate matching unit 7, and the result is retransmitted as a third transmission by the transmission unit 9.

By contrast, considering the case that IR in the receiver is desired, then following the first NACK, version 2 is transmitted to the rate matching unit 7, to produce a second transmission by the transmission unit 9. Following a further NACK, version 3 is transmitted to the rate matching unit 5 to produce a third transmission by the transmission unit 9.

In this case, simulations show that 0.8 dB performance degradation at a FER of 0.01 is observed for the second embodiment compared with the first embodiment. However, this variation still outperforms Chase combining with the gain of 2 dB. Note that this comparison is done between the second embodiment and Chase combining with a maximum number of transmission attempts of 4. If the second embodiment is compared with Chase combining with a maximum number of transmission attempts of 3, the gain is 2.7 dB. Moreover, compared with the method of Siemens with a maximum number of transmission attempts of 3, the second embodiment has a gain of 1.2 dB.

We now turn to a third embodiment of the invention. Again, the structure of the transmitter is as shown in FIG. 1, but in this case an encoder 1 is used having a coding rate of ⅕. Therefore, the output of Turbo encoder can be described as $(S, P_1, P_2, P_3, P_4)$, where $P_3$ and $P_4$ are the two further parity bit streams. Suppose that the required coding rates for the transmissions are ¼, ½ and ⅓. Based on our invention, five IR redundancy versions can be constructed as follows:

Version 1, $(S, P_1, P_2, P_3, P_4)$. Upon receiving this version, the rate matching unit 7 is arranged to transmit all the systematic bits, and to puncture the parity bits $P_1$, $P_2$, $P_3$, and $P_4$ to get the desired coding rate for transmission;

Version 2, $(P_1, P_2, P_3, P_4, S)$. For this version, the rate matching unit 7 will arrange that all the parity bits $P_1$ will be transmitted and parity bits $P_2$, $P_3$, $P_4$ and the systematic bits S will be punctured to get the desired coding rate for transmission;

Version 3, $(P_2, P_3, P_4, S, P_1)$. For this version, the rate matching unit 7 will arrange that all the parity bits $P_2$ will be transmitted and parity bits $P_1$, $P_3$, $P_4$ and the systematic bits S will be punctured to get the desired coding rate for transmission;

Version 4, $(P_3, P_4, S, P_1, P_2)$. For this version, the rate matching unit 7 will arrange that all the parity bits P3 will be transmitted and parity bits $P_1$, $P_2$, $P_4$ and the systematic bits S will be punctured to get the desired coding rate for transmission;

Version 5, $(P_4, S, P_1, P_2, P_3)$. For this version, the rate matching unit 7 will arrange that all the parity bits P4 will be transmitted and parity bits $P_1$, $P_2$, $P_3$ and the systematic bits S will be punctured to get the desired coding rate for transmission.

The operation of the third embodiment is as follows.

Initially, the version 1 is sent to the rate matching unit 7, and the result sent to the transmission unit 9 to generate a first transmission.

In the case the receiver is desired to perform Chase combining, if no acknowledgement (NACK) is received after the first transmission, version 1 will be sent repeatedly to the rate matching unit 7 to generate further identical transmissions by the transmission unit 9 until the maximum number of transmission attempts is reached.

In the case that the receiver is desired to perform IR, if no acknowledgement (NACK) is received after the first transmission, the redundancy version store 5 will send version 2 to the rate matching unit 7, which converts it to the desired coding rate and sends it to the transmission unit 9 to generate a second transmission. Similarly, version 3 is used to produce the third transmission; version 4 is used to produce the fourth transmission; and version 5 is used to produce the fifth transmission. Further retransmissions, if any, can be chosen by sending further selections among the five versions to the rate matching unit 5.

Many variations of the transmitter of FIG. 1 are possible within the scope of the invention as will be clear to a skilled reader.

For example, the store 5 can be placed at the output of the encoder 1, with a direct path to the rate matching unit 7. The store 5 then would only store the output of the encoder. To generate the initial transmission, the store 5 could send this data to the rate matching unit 7, which sends its output to the transmission unit 9. In response to a retransmission request the store 5 could send its stored data to the permutation unit 3, which would forward the result to the rate matching unit. Note that this variation of the system in FIG. 1 reduces the memory requirement of the transmitter.

In another functionally equivalent variation, the order of the redundancy versions store 5 and the rate matching unit 7 can be reversed, so that the redundancy version store 5 stores multiple version of the encoded signal which have all been converted by the rate matching unit 5 to have the coding rate suitable for transmission.

Figure 3:
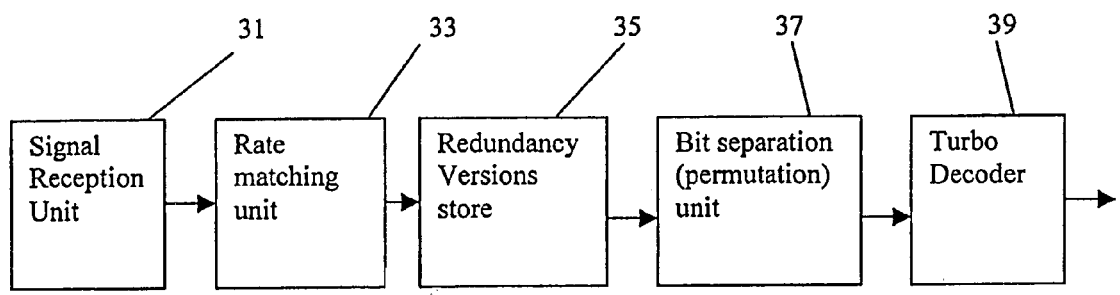
FIG. 3 shows the structure of a receiver which is an embodiment of the invention.
Figure 4:
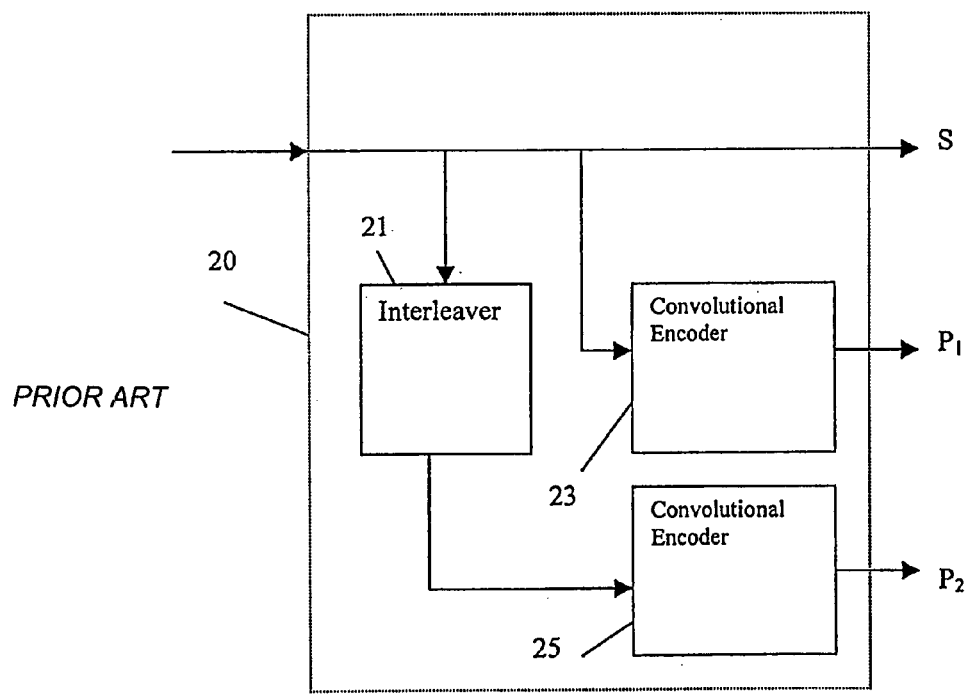
FIG. 4 shows the structure of a known turbo encoder.

Turning to FIG. 3, a receiver according to the invention is shown for receiving signals from the transmitter of FIG. 1. It includes a physical signal reception unit 31 (e.g. radio reception unit if the signal is transmitted by radio).

A signal received from the transmitter of FIG. 1 by the signal reception unit 31 is passed to a rate matching unit 33, which converts it to a format suitable for a turbo decoder 39. The output of the rate matching unit 33 is passed to a store 35. Thus, when multiple signals relating to the same message are transmitted by the transmitter of FIG. 1 (as described below), they are accumulated in the store 35. The output of the store 35 is transmitted via a bit separation (permutation unit) 37 to the decoder 39.

As in the case of the transmitter, various modifications to the order of the units 33, 35, 37 can be made within the scope of the invention. For example, the units 35 and 37 can be reversed, so that the permutation unit 37 only has to operate once on a given received signal. The permutation unit functions differently according to which version of the signal it is operating on. For example, in the case described above in which one of the versions of the signal transmitted by the transmitter is derived without a permutation carried out by the permutation unit 3, the permutation unit 37 preferably makes no modification to that version of the signal. More generally, the permutation unit 37 is preferably arranged simply to reverse the permutation carried out by the permutation unit 3 on the corresponding version of the message.

The decoder 39 attempts to use the signals it receives to reconstruct the message sent by the transmitter. The decoder 39 also generates ACK/NACK signals for return to the transmitter according to the definition of the HARQ scheme employed. These cause further signals to be transmitted by the transmitter relating to the same message. The decoder 39 employs newly arrived signals in combination with the signals previously stored in the store 35 to attempt to reconstruct the message.

Although the invention has been described above in relation to specific embodiments, the invention is not limited in this respect, and many variants are possible within the scope of the invention. For example, Furthermore, the embodiments are described above using the term "units", the "units" may not be physically separate, but for example may be implemented as software modules running on any number of processors.

REFERENCES

The following references are incorporated herein by reference in their entirety. All are published on the website http://www.3gpp.org.
[1] A New Hybrid-ARQ Scheme Using Incremental Redundancy: Motorola, R1-01-1014, 3GPP TSG RAN1 Ad Hoc on HSDPA, France, November 2001
[2] Rate Matching for Incremental Redundancy in HSDPA: Ericsson, R1-01-1045, 3GPP TSG RAN1 Ad Hoc on HSDPA, France, November 2001.
[3] Performance Comparison of Various IR Scheme: Motorola, R1-01-1015, 3GPP TSG RAN1 Ad Hoc on HSDPA, France, November 2001
[4] Implementation of IR by means of Rate Matching: Siemens, R1-01-1028, 3GPP TSG RAN1 Ad Hoc on HSDPA, Franc, November 2001.

The invention claimed is:

1. A method of transmitting a message comprising:
(i) receiving a selection of a transmission format from a predetermined plurality of transmission formats associated with a corresponding coding rate, whereby a selected format is obtained;
(ii) generating from the message a first version of encoded data having a first coding rate;
(iii) permuting said first version to obtain a plurality of further versions of said data also having the first coding rate, said plurality of further versions comprising systematic bits and parity bits;
(iv) converting one of said plurality of further versions to a second coding rate, wherein during the conversion, the systematic bits are punctured, the second coding rate being the corresponding coding rate of the selected format, and transmitting, in the selected format, a first signal generated from the converted version;
(v) in response to a retransmission request, if the selected format is one of a predetermined subset of the formats, retransmitting, in the selected format, the first transmitted signal; and
(vi) in response to a retransmission request, if the selected format is not one of a predetermined subset of the formats, retransmitting, in the selected format, a further signal generated from another of said plurality of further versions and having said second coding rate.

2. A method according to claim 1 in which said plurality of further versions are stored at the first coding rate and one of the stored versions is converted to the second coding rate upon receipt of each retransmission request.

3. A transmitter for use in a communication system, the transmitter comprising:
(i) means to register a selection of one of a plurality of predetermined transmission formats, each associated with a corresponding second coding rate;
(ii) an encoder for receiving a message and using the message to generate a first version of encoded data having a first coding rate;
(iii) a permutation unit for permuting said first version to obtain a plurality of further versions of said encoded data also having the first coding rate, said plurality of further versions comprising systematic bits and parity bits and at least one of said plurality of further versions being arranged such that, during conversion to a second coding rate in a rate matching unit, the systematic bits are punctured;
(iv) a rate matching unit for converting data at the first coding rate to the corresponding coding rate of the selected format; and
(v) a signal transmission unit for receiving the output of the rate matching unit and transmitting a corresponding signal, in the selected format; and
the transmitter being arranged to transmit a first signal, in the selected format, derived from one of said versions, and, in response to a retransmission request, if the selected format is one of a predetermined subset of formats, to retransmit the first signal, in the selected format, and in response to a retransmission request, if the selected format is not one of a predetermined subset of formats, to transmit a further signal, in the selected format, generated from another of said plurality of further versions.

4. A transmitter according to claim 3 comprising a buffer for storing said plurality of further versions at the first coding rate and for transmitting a selected one of said plurality of further versions to the rate matching unit upon receipt of a retransmission request.

5. A communication system including at least one transmitter comprising:
(vi) means to register a selection of one of a plurality of predetermined transmission formats, each associated with a corresponding second coding rate;
(vii) an encoder for receiving a message and using the message to generate a first version of encoded data having a first coding rate;
(viii) a permutation unit for permuting said first version to obtain a plurality of further versions of said encoded data also having the first coding rate, said plurality of further versions comprising systematic bits and parity bits and at least one of said plurality of further versions being arranged such that, during conversion to a second coding rate in a rate matching unit, the systematic bits are punctured;
(ix) a rate matching unit for converting data at the first coding rate to the corresponding coding rate of the selected format; and
(x) a signal transmission unit for receiving the output of the rate matching unit and transmitting a corresponding signal, in the selected format; and
the transmitter being arranged to transmit a first signal, in the selected format, derived from one of said versions, and, in response to a retransmission request, if the selected format is one of a predetermined subset of formats, to retransmit the first signal, in the selected format, and in response to a retransmission request, if the selected format is not one of a predetermined subset of formats, to transmit a further signal, in the selected format, generated from another of said plurality of further versions;

and at least one receiver adapted to receive signals from the transmitter and reconstruct messages from them.

6. A receiver for reconstructing a message from encoded signals, the encoded signals being transmitted by a transmitter comprising:
   (i) means to register a selection of one of a plurality of predetermined transmission formats, each associated with a corresponding second coding rate;
   (ii) an encoder for receiving a message and using the message to generate a first version of encoded data having a first coding rate;
   (iii) a permutation unit for permuting said first version to obtain a plurality of further versions of said encoded data also having the first coding rate, said plurality of further versions comprising systematic bits and parity bits and at least one of said plurality of further versions being arranged such that, during conversion to a second coding rate in a rate matching unit, the systematic bits are punctured;
   (iv) a rate matching unit for converting data at the first coding rate to the corresponding coding rate of the selected format; and
   (v) a signal transmission unit for receiving the output of the rate matching unit and transmitting a corresponding signal, in the selected format; and
   the transmitter being arranged to transmit a first signal, in the selected format, derived from one of said versions, and, in response to a retransmission request, if the selected format is one of a predetermined subset of formats, to retransmit the first signal, in the selected format, and in response to a retransmission request, if the selected format is not one of a predetermined subset of formats, to transmit a further signal, in the selected format, generated from another of said plurality of further versions;
   the receiver including:
   a decoder for decoding signals having a first coding rate;
   a signal reception unit for receiving signals at a second coding rate;
   a rate dematching unit for converting the received signals from the second coding rate to the first coding rate; and
   a permutation unit for permuting the converted signals and passing them to the decoder;
   wherein the permutation unit is operative to permute successive received signals representative of a single message in differing ways.

7. A method of reconstructing a message from encoded signals, the encoded signals being transmitted by a transmitter comprising:
   (i) means to register a selection of one of a plurality of predetermined transmission formats, each associated with a corresponding second coding rate;
   (ii) an encoder for receiving a message and using the message to generate a first version of encoded data having a first coding rate;
   (iii) a permutation unit for permuting said first version to obtain a plurality of further versions of said encoded data also having the first coding rate, said plurality of further versions comprising systematic bits and parity bits and at least one of said plurality of further versions being arranged such that during conversion to a second coding rate in a rate matching unit, the systematic bits are punctured;
   (iv) a rate matching unit for converting data at the first coding rate to the corresponding coding rate of the selected format; and
   (v) a signal transmission unit for receiving the output of the rate matching unit and transmitting a corresponding signal, in the selected format; the transmitter being arranged to transmit a first signal, in the selected format, derived from one of said versions, and in response to a retransmission request, if the selected format is one of a predetermined subset of formats, to retransmit the first signal, in the selected format, and, in response to a retransmission request, if the selected format is not one of a predetermined subset of formats, to transmit a further signal, in the selected format, generated from another of said versions;
   the method using a receiver comprising a decoder for decoding signals having a first coding rate; a signal reception unit for receiving signals at a second coding rate; a rate dematching unit for converting the received signals from the second coding rate to the first coding rate; and a permutation unit for permuting the converted signals and passing them to the decoder; wherein the permutation unit is operative to permute successive received signals representative of a single message in differing ways, the method comprising the steps of:
   receiving multiple encoded signals, the multiple encoded signals being derived from the message and having a second coding rate;
   converting the received signals from the second coding rate to the first coding rate; and
   permuting one or more of the converted signals; and passing the converted signals, including the permuted signals, to the decoder.

8. A method according to claim 1, wherein each of said plurality of further versions comprises systematic bits, first parity bits and second parity bits.

9. A method according to claim 8, wherein at least one of said plurality of further versions is arranged such that during conversion to a second coding rate in (iv), the systematic bits and the first parity bits are punctured and the second parity bits are not punctured.

10. A method according to claim 8, wherein at least one of said plurality of further versions is arranged such that during conversion to a second coding rate in (iv), the systematic bits and the second parity bits are punctured and the first parity bits are not punctured.

11. A transmitter according to claim 3, wherein each of said plurality of further versions comprises systematic bits, first parity bits and second parity bits.

12. A transmitter according to claim 11, wherein at least one of said plurality of further versions is arranged such that, during conversion to a second coding rate in a rate matching unit, the systematic bits and the first parity bits are punctured and the second parity bits are not punctured.

13. A transmitter according to claim 11, wherein at least one of said plurality of further versions is arranged such that, during conversion to a second coding rate in a rate matching unit, the systematic bits and the second parity bits are punctured and the first parity bits are not punctured.

* * * * *